United States Patent [19]
Bell

[11] Patent Number: 5,742,204
[45] Date of Patent: Apr. 21, 1998

[54] DIGITALLY PROGRAMMABLE DIFFERENTIAL ATTENUATOR WITH TRACKING COMMON MODE REFERENCE

[75] Inventor: Timothy Arthur Bell, Melbourne Beach, Fla.

[73] Assignee: Harris Corporation, Melbourne, Fla.

[21] Appl. No.: 608,812

[22] Filed: Feb. 29, 1996

[51] Int. Cl.[6] .................................................. H03F 3/45
[52] U.S. Cl. ........................... 330/258; 327/563; 327/308
[58] Field of Search ................................. 330/258, 261, 330/252, 253; 327/563, 308

[56] References Cited

U.S. PATENT DOCUMENTS

| 3,337,749 | 8/1967 | Lee et al. | |
|---|---|---|---|
| 4,683,386 | 7/1987 | Kamikawara | 333/81 |
| 4,803,462 | 2/1989 | Hester et al. | 327/407 |
| 4,810,949 | 3/1989 | Schiemenz et al. | 333/81 |
| 4,833,418 | 5/1989 | Quintus et al. | 330/258 |
| 4,888,496 | 12/1989 | Schmitz | |
| 4,918,399 | 4/1990 | Devecchi et al. | 330/253 |
| 4,933,644 | 6/1990 | Fattaruso et al. | 330/258 |
| 5,049,831 | 9/1991 | Westwick | 330/258 |
| 5,095,282 | 3/1992 | Dayton | 330/69 |
| 5,254,956 | 10/1993 | Nishijima | 330/258 |
| 5,298,809 | 3/1994 | Yamaguchi | 330/258 |
| 5,300,896 | 4/1994 | Suesserman | 330/260 |
| 5,351,030 | 9/1994 | Kobayashi et al. | 333/81 |
| 5,412,343 | 5/1995 | Rijns | 330/258 |
| 5,428,316 | 6/1995 | Molnar | 330/255 |

FOREIGN PATENT DOCUMENTS

| 4-135305 | 5/1992 | Japan | 330/258 |

*Primary Examiner*—Timothy P. Callahan
*Assistant Examiner*—Terry L. Englund
*Attorney, Agent, or Firm*—Rogers & Killeen

[57] ABSTRACT

A differential attenuator and method for providing an attenuated differential output in which an AC common mode component has been reduced. The attenuator includes (a) a voltage divider with two resistive elements for providing the attenuated differential output and a common mode node between the two elements, and (b) a differential amplifier for generating a DC common mode reference which is substantially the same as the DC common mode component in the outputs of the differential amplifier. The differential amplifier has a common mode output connected to the common mode node to provide the DC common mode reference thereto so that the AC common mode component is reduced in the attenuated differential output.

17 Claims, 3 Drawing Sheets

R2=R3=R5
I3=I4=I6
I2=I5=I7
$V_{BEQ5} = V_{BEQ6}$
$V_{BEQ3} = V_{BEQ4} = V_{BEQ7}$

DIGITALLY PROGRAMMABLE DIFFERENTIAL ATTENUATOR WITH TRACKING COMMON MODE REFERENCE

BACKGROUND OF THE INVENTION

The present invention is directed to differential attenuators, and more particularly to a differential attenuator and method for reducing an AC common mode component in the outputs of the differential attenuator to reduce the distortion caused by the AC common mode component.

A conventional differential attenuator may be provided from a resistive voltage divider, such as illustrated in FIG. 1, which may include two pairs of resistors RA and RB. The output voltages are provided from between resistors RA and RB in each of the two pairs, and the resistor values may be selected to provide linear or logarithmic attenuation steps. This arrangement is typically satisfactory for differential inputs which do not include an AC common mode component (an average of the positive and negative differential input voltages at node CM which is not zero and which varies.) However, differential outputs from a differential attenuator will be distorted if the inputs include an AC common mode component. The distortion can be especially significant where the attenuation is large, even with a small common mode component due to the fact that the common mode component is not attenuated.

A known method of reducing the distortion caused by the common mode component is to force node CM to a set DC voltage to prevent it from varying with the common mode component, and thereby causing the AC common mode component to be attenuated by the same amount as the desired differential signal. However, this increases quiescent current unless the DC voltage happens to be close to the actual DC common mode component.

Accordingly, it is an object of the present invention to provide a novel differential attenuator and method for providing an attenuated differential output in which the AC common mode component has been reduced that obviate the problems of the prior art.

It is another object of the present invention to provide a novel differential attenuator and method in which a differential amplifier provides a DC common mode reference to a voltage divider to thereby reduce the AC common mode component from the output from the voltage divider.

It is yet another object of the present invention to provide a novel method for reducing distortion caused by an AC common mode component in which a DC common mode reference is generated which is the same as the DC common mode component, and the DC common mode reference is provided to a voltage divider to reduce the AC common mode component from the voltage divider's output.

It is still another object of the present invention to provide a novel differential attenuator and method in which the resistances of resistive elements in a voltage divider in the attenuator are digitally controlled.

It is a further object of the present invention to provide a novel differential attenuator and method in which a differential amplifier includes plural resistors and plural transistors which decrease a supply voltage in the generation of the differential signals and in the generation of the DC common mode reference, and which have respectively similar operating characteristics so that the decreases in the supply voltage for the differential signals and DC common mode reference are substantially the same, whereby the DC common mode reference tracks (i.e., is substantially the same as and moves with) the DC common mode component.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
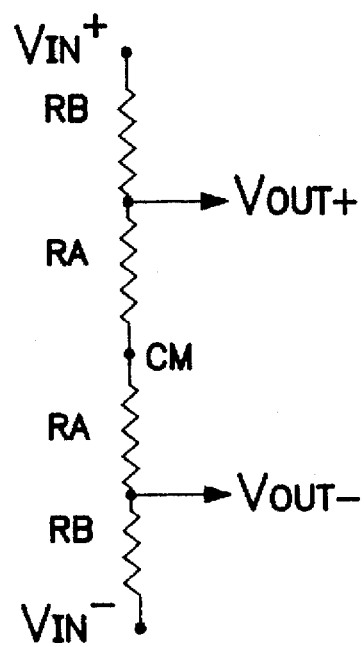
FIG. 1 is a circuit diagram of a resistive voltage divider of the prior art.
Figure 2:
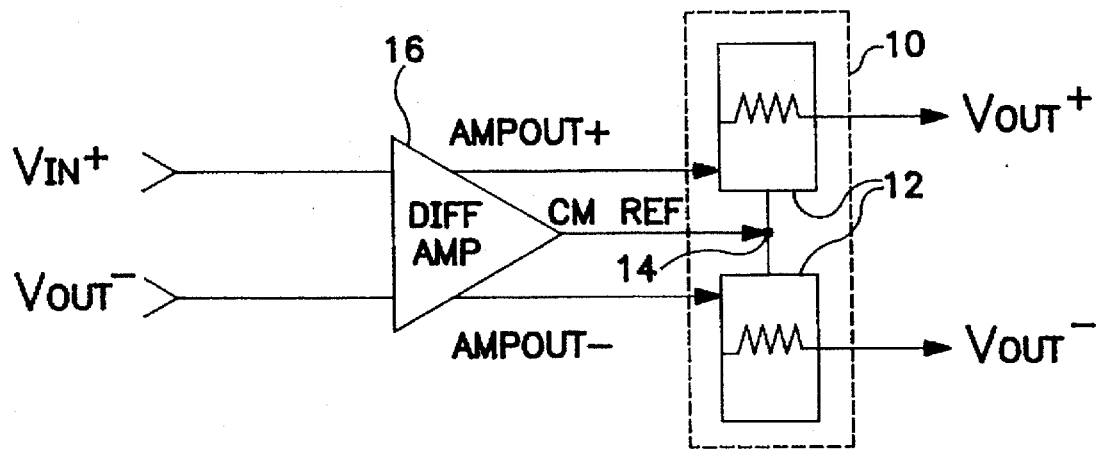
FIG. 2 is a block diagram of an embodiment of the present invention.

An embodiment of the differential attenuator and method of the present invention provides an attenuated differential output in which an AC common mode component has been reduced. With reference now to FIG. 2, the attenuator may include a resistive voltage divider 10 with two resistive elements 12 for providing the attenuated differential outputs VOUT+ and VOUT– and a common mode node 14 between elements 12, and a differential amplifier 16 for receiving input signals VIN+ and VIN– which include AC and DC common mode components, for providing differential signals AMPOUT+ and AMPOUT– which include both AC and DC common mode components, and for generating a DC common mode reference voltage CMREF which tracks the DC portion of the common mode component in the outputs of differential amplifier 16. Differential amplifier common mode reference CMREF is connected to common mode node 14 to provide the DC common mode reference thereto in order to reduce the AC common mode component from the attenuated differential outputs VOUT+ and VOUT–.

Figure 3:
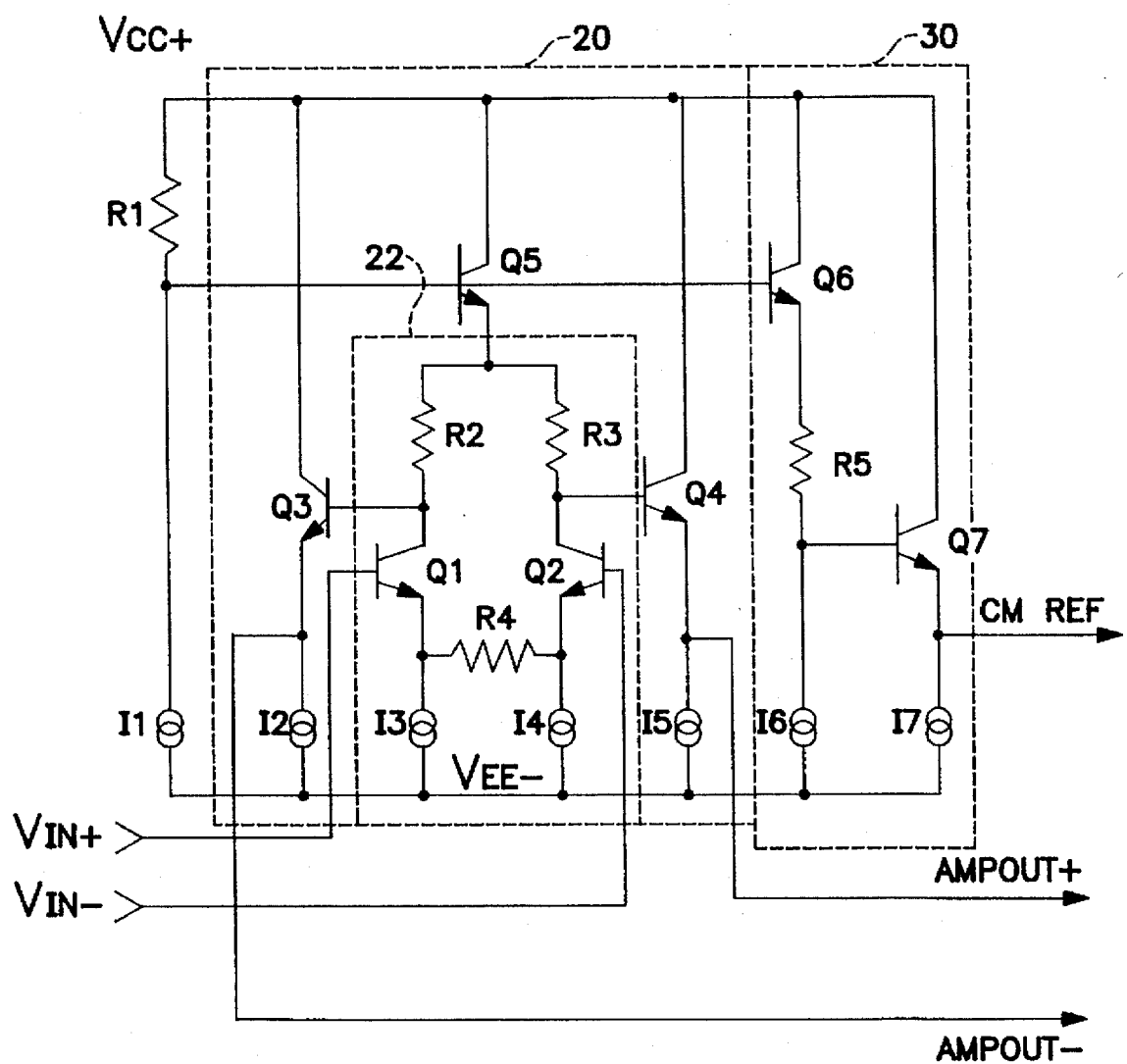
FIG. 3 is a circuit diagram of an embodiment of the differential amplifier of the present invention.

With reference now to FIG. 3, a preferred embodiment of a differential amplifier for the present invention (such as amplifier 16 in FIG. 2) may include a difference circuit 20 for generating separate differential signals AMPOUT+ and AMPOUT– with the common mode components therein, and a common mode circuit 30 for generating a DC common mode reference CMREF. Difference circuit 20 may include an amplifier circuit 22 for amplifying VIN and transistors Q3 and Q4 for providing AMPOUT+ and AMPOUT–. Amplifier circuit 22 may be comprised of transistors Q1 and Q2 operated by VIN and resistors R2, R3 and R4, and connected to a supply voltage Vcc through a first transistor Q5. Common mode circuit 30 may include a controlling transistor Q6 connected through resistor R5 to a control terminal of a common mode transistor Q7 which provides CMREF. The transistors are depicted in the preferred embodiments as bipolar junction transistors, although the invention is not limited to devices of this type.

In the preferred embodiments, the resistances R2, R3 and R5 are the same, the currents I3, I4 and I6 are the same, and the currents I2, I5 and I7 are the same. The transistors may be made in the same process (e.g., in an integrated circuit) so that their operating characteristics will be similar, namely that the base-to-emitter voltages of Q5 and Q6 will be the same and the base-to-emitter voltages of Q3, Q4 and Q7 will be the same. (Reference to components, characteristics or voltages being the "same" or "similar" means that they are substantially the same within the normal skill of the art; an unusually high degree of similarity is not required.)

In operation, difference circuit 20 provides a DC common mode output level, AMPOUT, by effectively subtracting voltages from Vcc, as in the following:

AMPOUT+=Vcc−I1R1−VBEQ5−I4R3−VBEQ4
AMPOUT−=Vcc−I1R1−VBEQ5−I3R2−VBEQ3 and common mode circuit 30 provides CMREF by effectively subtracting voltages from Vcc, as in the following:

CMREF=Vcc−I1R1−VBEQ6−I6R5−VBEQ7

In the embodiment of FIG. 3, if R2=R3=R5, and I3=I4=I6, and I2=I5=I7, and VBEQ5=VBEQ6, and VBEQ3=VBEQ4=VBEQ7, then CMREF will track the DC common mode component in the outputs of the differential amplifier, AMPOUT. These desired characteristics may be achieved by making the resistors of the same material and by providing the currents from a common source. The VBEs will change together with changes in temperature so that AMPOUT and CMREF will change together.

Figure 4:
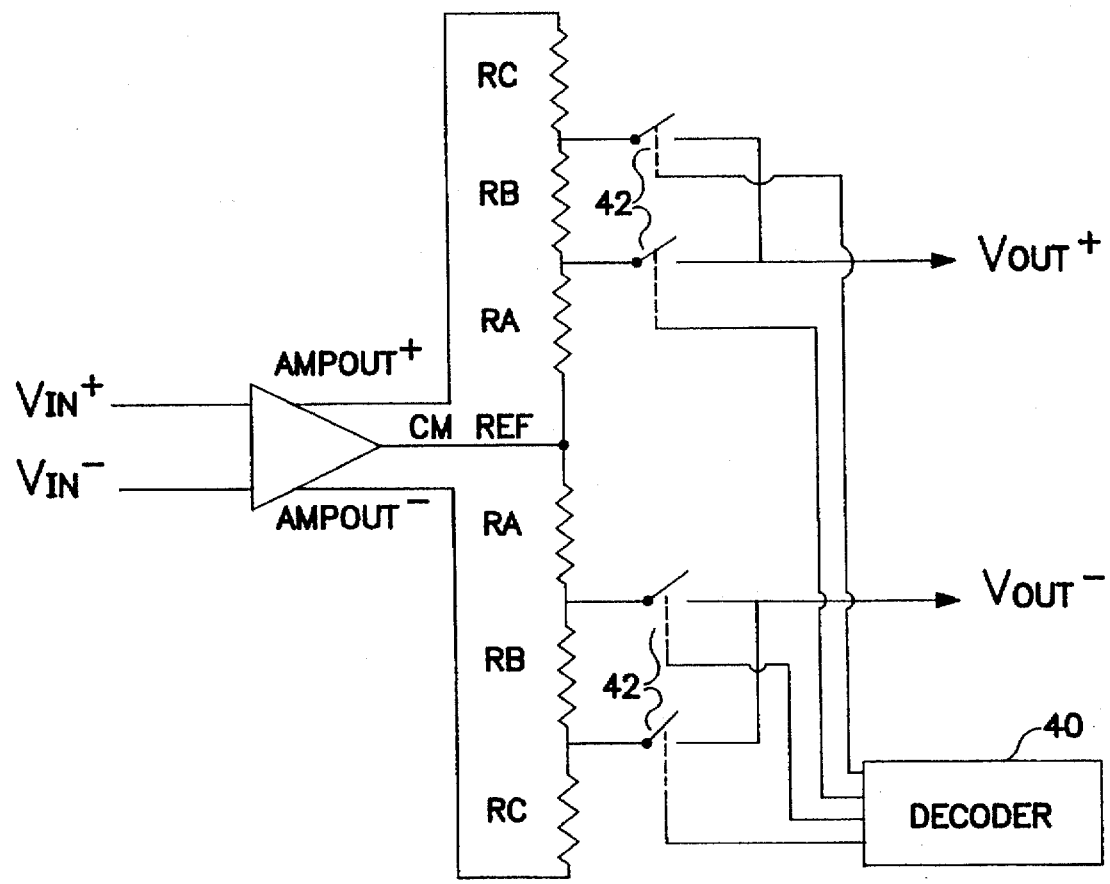
FIG. 4 is a circuit diagram of a further embodiment of the present invention with a digital decoder.

With reference now to FIG. 4, a further embodiment of the present invention may be digitally controlled so that operation of the differential attenuator can be programmed. A digital decoder 40 may be provided which receives instructions for operating switches 42 which selectively connect one or more of plural resistors RA, RB and RC (three resistors per resistive element are illustrated, although the invention is not so limited.) The present invention, such as the embodiment of FIG. 4, is desirably in a single integrated circuit, and may find application in various devices, such as a PSK modulator integrated circuit.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A differential attenuator for receiving an input which has AC and DC common mode components and for providing an attenuated differential output in which the AC common mode component has been reduced, the differential attenuator comprising:

a voltage divider comprising two resistive elements for providing the attenuated differential output, and a common mode node between said two elements; and a differential amplifier for receiving the differential attenuator input, for providing a separate differential outer to each of said two elements, and for generating a DC common mode reference which is the same as the DC common mode component in the differential outputs of said differential amplifier, said differential amplifier having a common mode output connected to said common mode node for providing said common mode reference thereto, whereby the AC common mode component is reduced in the attenuated differential output, and wherein said differential amplifier comprises a difference circuit for generating the separate differential outputs with the common mode components therein and a common mode circuit for generating the DC common mode reference, said difference and common mode circuits having first resistors and first transistors therein which decrease a first supply voltage and which have respectively similar operating characteristics so that the decreases in the first supply voltage are the same.

2. The differential attenuator of claim 1 wherein said difference circuit comprises two transistors with resistor-connected emitters and two of said first resistors which connect collectors of said two transistors to the first supply voltage through one of said first transistors, and wherein said common mode circuit comprises a common mode transistor for providing the common mode reference from an emitter thereof and a second one of said first transistors acting as a controlling transistor operated concurrently with said one of said first transistors for connecting a base of said common mode transistor to the first supply voltage through one of said first resistors which connects a terminal of said controlling transistor to the base of said common mode transistor.

3. The differential attenuator of claim 2 wherein said difference circuit further comprises two of said first transistors with emitters connected to outputs for providing the separate differential signals and bases connected to collectors of said two transistors which have the resistor-connected emitters, and wherein said common mode transistor is another one of said first transistors.

4. The differential attenuator of claim 1 wherein said differential circuit comprises an amplifier circuit and one of said first transistors for connecting said amplifier circuit to said first supply voltage, and said common mode circuit comprises a common mode transistor for providing the common mode reference from a terminal thereof and a controlling transistor, which is another one of said first transistors operated concurrently with said first transistor of said differential circuit for connecting a control terminal of said common mode transistor to the first supply voltage.

5. The differential attenuator of claim 4 wherein said first transistor of said differential circuit and said controlling transistor are similar bipolar transistors.

6. The differential attenuator of claim 1 wherein said two elements are connected in series between a first node and a second node with said common mode node between said two elements, and wherein said first and second nodes receive the differential outputs from said differential amplifier.

7. The differential attenuator of claim 6 wherein each of said two elements comprise plural resistors, and wherein a first said attenuated differential output is provided from between two of said resistors in a first of said two elements and a second said attenuated differential output is provided from between two of said resistors in a second of said elements.

8. The differential attenuator of claim 1 further comprising means for varying resistances of said two elements.

9. The differential attenuator of claim 8 wherein each of said two elements comprise plural resistors, and wherein said means for varying comprises switches for selectively connecting said plural resistors to the attenuated differential output.

10. The differential attenuator of claim 9 further comprising a digital decoder for controlling said switches so that the differential attenuator is digitally programmable.

11. A digitally controlled differential attenuator for receiving an input which has a common mode component and for providing an attenuated differential output in which an AC portion of the common mode component has been reduced, the differential attenuator comprising:

a voltage divider comprising two sets of plural resistors connected in series between first and second nodes for providing the attenuated differential output from between two of said resistors in each of said sets, and a common mode node between said two sets;

plural switches for selectively connecting said plural resistors to the attenuated differential output to thereby vary the resistance provided by each of said two sets;

a digital decoder for controlling said plural switches; and a differential amplifier for receiving the differential attenuator input, for providing a separate differential output to each of said first and second nodes, and for generating a DC common mode reference which is the same as a DC common mode component in the outputs from said differential amplifier, said differential amplifier having a common mode output connected to said common mode node for providing said DC common mode reference thereto.

12. The differential attenuator of claim 11 wherein said differential amplifier comprises a differential network for providing the separate differential outputs and a common mode network for providing the DC common mode reference, said differential network comprising an amplifier circuit and a first transistor for connecting said amplifier circuit to a supply voltage, said common mode network comprising a common mode transistor for providing the common mode reference from an emitter thereof and a controlling transistor for connecting a base of said common mode transistor to the supply voltage, wherein said first transistor and said controlling transistor have a common base and are similar bipolar transistors.

13. A method of reducing distortion caused by an AC common mode component in an input which is processed to provide a differentially attenuated output, the method comprising the steps of:

(a) providing from a differential amplifier differential signals which include the AC common mode component to a resistive voltage divider which is for providing the differentially attenuated output;

(b) generating a DC common mode reference in the differential amplifier which is the same as a DC common mode component in the differential signals of the differential amplifier;

(c) providing the DC common mode reference to the voltage divider to thereby reduce the AC common mode component from the output of the voltage divider, whereby the reduction of the AC common mode component reduces the distortion in the output from the voltage divider, and (d) varying resistance in the resistive voltage divider.

14. The method of claim 13 where the voltage divider has two sets of plural resistors, and further comprising the step of selectively connecting said plural resistors to the output of the voltage divider.

15. The method of claim 14 further comprising the step of controlling operation of the selectively connecting step with a digital decoder.

16. A differential attenuator for receiving an input which has AC and DC common mode components and for providing an attenuated differential output in which the AC common mode component has been reduced, the differential attenuator comprising:

a voltage divider comprising two resistive elements for providing the attenuated differential output, and a common mode node between said two elements; and a differential amplifier for receiving the differential attenuator input, for providing a separate differential output to each of said two elements, and for generating a DC common mode reference which is the same as the DC common mode component in the differential outputs of said differential amplifier, said differential amplifier having a common mode output connected to said common mode node for providing said common mode reference thereto, whereby the AC common mode component is reduced in the attenuated differential output, and wherein said differential amplifier comprises a differential network for providing the separate differential outputs and a common mode network for providing the DC common mode reference, said differential network comprising an amplifier circuit and a first transistor for connecting said amplifier circuit to a first supply voltage, said common mode network comprising a common mode transistor for providing the common mode reference from a and terminal thereof and a controlling transistor operated concurrently with said first transistor for connecting a control terminal of said common mode transistor to the first supply voltage.

17. The differential attenuator of claim 16 wherein said first transistor and said controlling transistor are similar bipolar transistors.

* * * * *